United States Patent [19]
Yang

[11] Patent Number: 5,376,568
[45] Date of Patent: Dec. 27, 1994

[54] METHOD OF FABRICATING HIGH VOLTAGE COMPLEMENTARY METAL OXIDE SEMICONDUCTOR TRANSISTORS

[75] Inventor: Sheng-Hsing Yang, Hsinchu, Taiwan, Prov. of China

[73] Assignee: United Microelectronics Corp., Hsinchu, Taiwan, Prov. of China

[21] Appl. No.: 186,766

[22] Filed: Jan. 25, 1994

[51] Int. Cl.$^5$ ............................................. H01L 21/70
[52] U.S. Cl. .................................... 437/40; 437/34; 437/56; 437/57; 148/DIG. 126
[58] Field of Search ................ 437/34, 40, 56, 57, 437/58; 148/DIG. 126; 257/369, 371

[56] References Cited

U.S. PATENT DOCUMENTS

| | | | |
|---|---|---|---|
| 4,285,116 | 8/1981 | Meguro | 437/34 |
| 4,780,428 | 10/1988 | Nakakura et al. | 437/40 |
| 4,795,716 | 1/1989 | Yilmaz et al. | 437/34 |
| 4,978,628 | 12/1990 | Rosenthal | 437/34 |
| 5,047,358 | 9/1991 | Kosiak et al. | 437/34 |
| 5,169,796 | 12/1992 | Murray et al. | 437/34 |
| 5,242,841 | 9/1993 | Smayling et al. | 437/40 |

*Primary Examiner*—Tom Thomas
*Attorney, Agent, or Firm*—Ladas & Parry

[57] ABSTRACT

A method for manufacturing CMOS transistors for integrated circuits which have metal gates and heavily doped source and drain electrode regions, thereby improving their resisting capability to a high voltage while reducing cycle time for manufacture. As a result, the performance of the transistors is improved and the cost of manufacture is reduced.

4 Claims, 12 Drawing Sheets

METHOD OF FABRICATING HIGH VOLTAGE COMPLEMENTARY METAL OXIDE SEMICONDUCTOR TRANSISTORS

BACKGROUND OF THE INVENTION

The present invention is directed to a method for manufacturing complementary metal oxide semiconductor (CMOS) transistors, and more particularly for manufacturing high voltage CMOS transistors of an integrated circuit, which includes NMOS (N type metal oxide semiconductor) and PMOS (P type metal oxide semiconductor) devices.

In the present state of art, methods for manufacturing CMOS transistors of an integrated circuit include a process of forming a poly silicon gate electrode layer. Such a structure has a high breakdown voltage. However, this process has the shortcoming of a long cycle time, i.e. the manufacturing time for a cycle is long, so that manufacturing cost is raised by such a long cycle time. Moreover, CMOS transistors made by conventional methods have a serious latch-up problem, which is fatal to the operation of the entire circuit which uses such transistors.

SUMMARY OF THE INVENTION

The primary object of the present invention is to provide a method for fabricating a high voltage CMOS transistor which does not latch-up.

Another object of the present invention is to provide a method for fabricating a high voltage CMOS transistor with a shorter cycle time, i.e. a shorter manufacturing time.

The objects of the present invention are fulfilled by providing a method for fabricating an NMOS transistor on an N type substrate. The method comprises the following steps of: (a) forming a P well in a predetermined region of the substrate; (b) implanting P type impurity into a predetermined region in the P well, to form a P− drifting region; (c) implanting N type impurity into predetermined regions in the P well, to form N− drifting regions; (d) implanting N type impurity into predetermined regions in the N− drifting regions, to form N+ source and drain electrodes for the NMOS transistor; (e) implanting P type impurity into a predetermined region in the P− drifting region, to form a P+ contact regions for the NMOS transistor; (f) forming a field oxide layer over the N− drifting regions, the N+ source and drain electrodes, the P− drifting regions, and the P+ source and drain electrodes; (g) forming a gate oxide between the N− drifting regions; and (h) forming a metal gate of the NMOS transistor over the gate oxide.

BRIEF DESCRIPTION OF THE FIGURES

The present invention will become more fully understood from the detailed description given hereinafter and the accompanying drawings which are given by way of illustration only, and thus are not intended to limit the scope of the present invention. In the drawing.

DETAILED DESCRIPTION OF THE PREFERRED EMBODIMENT

Since a CMOS device made in accordance with the invention may be either an NMOS or a PMOS device, the processes discussed hereinafter apply equally well to either NMOS or PMOS devices and their methods of manufacture.

FIGS. 1a to 1f show the first preferred embodiment of the present invention, which is applied to an N type substrate 1 to produce a high voltage NMOS transistor. The method can be described as follow:

STEP 1

Figure 1A:
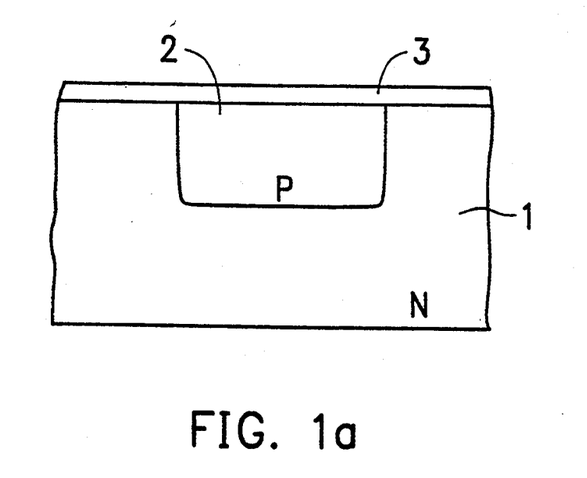
FIGS. 1a to 1f are cross sectional views showing a method of manufacturing a high voltage NMOS transistor on an N type substrate according to the present invention.

As shown in FIG. 1a, a P well 2 is formed in the N type substrate 1. This step may be done by various conventional methods understood by those skilled in the field. For example, a photoresist (not shown in the figures) is first applied over the substrate 1. The predetermined region for the P well in the photoresist is removed by lithography technology. After that, P type impurity is implanted and diffused into the substrate, to form the P well 2. An oxide layer 3 is grown over the substrate.

STEP 2

Figure 1B:
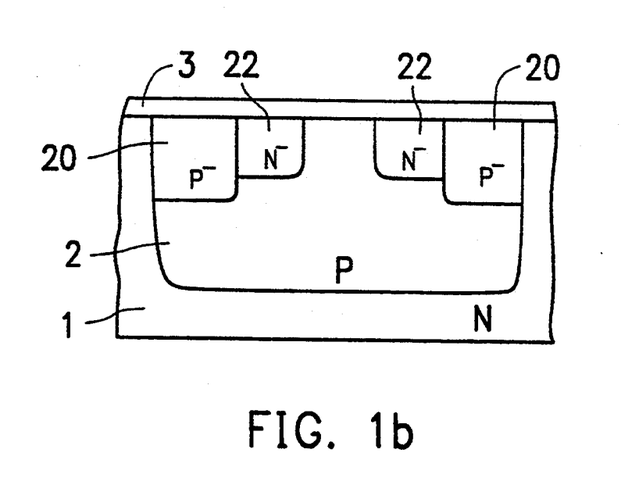

As shown in FIG. 1b, N type and P type impurities are implanted and diffused into the P well 2, to form two N− drifting regions 22 and two P− drifting regions 20 using the same lithography technology used in step 1.

STEP 3

Figure 1C:
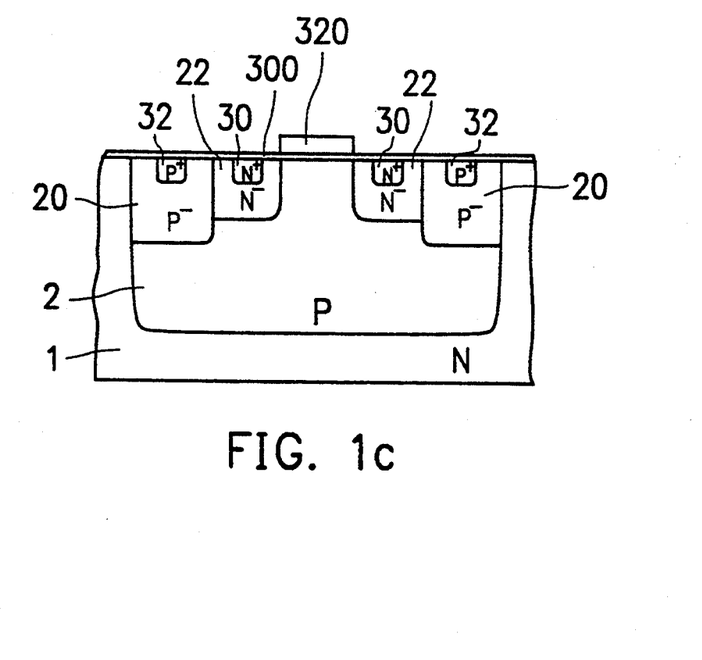

As shown in FIG. 1c, P type impurity is implanted into the P− drifting regions 20, to form P+ contact regions 32 of the P well 2. N type impurity is implanted into the N− drifting regions 22, to form N+ source and drain electrode regions 30. These two processes uses the same lithography technology used in step 1. For example, pad oxide layer 300 and silicon nitride layer 320 are first grown after oxide layer 3 has been removed; then the silicon nitride layer 320 is etched by conventional lithography technology. P type and N type impurities are then implanted. It does not matter whether the P type impurity or the N type impurity is implanted first.

STEP 4

Figure 1D:
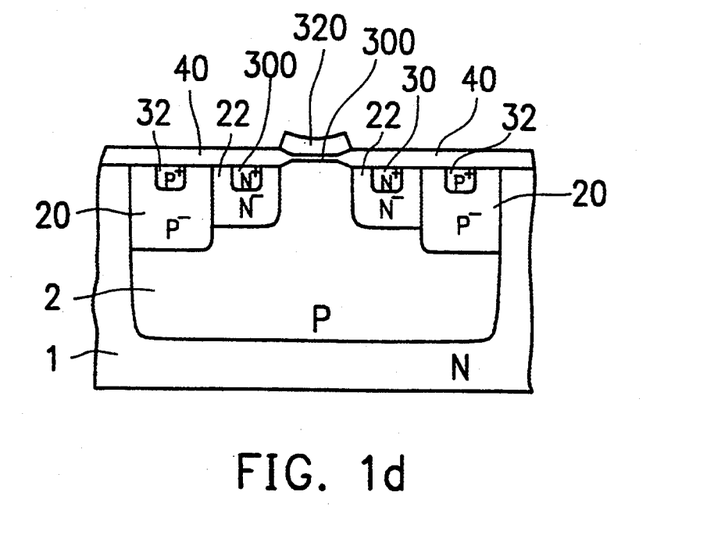

As shown in FIG. 1d, a field oxide layer 40 is formed on the P− drifting regions 20, the N− drifting regions 22, the P+ contact regions 32, and the N+ source and drain electrode regions 30 by, for example, thermally growing the field oxide layer 40 in a suitable oxidizing atmosphere.

STEP 5

Figure 1E:
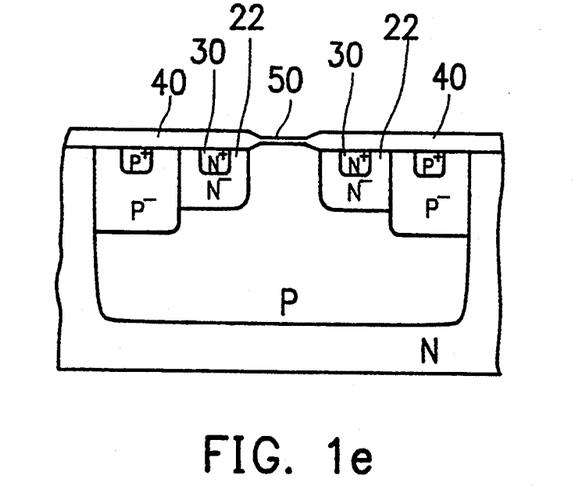

As shown in FIG. 1e, a gate oxide layer 50 is formed between the N− drifting regions 22. This is done by, for example, removing the silicon nitride layer 320 and the pad oxide layer 300 (shown in FIG. 1d), then thermally growing the gate oxide layer 50.

STEP 6

Figure 1F:
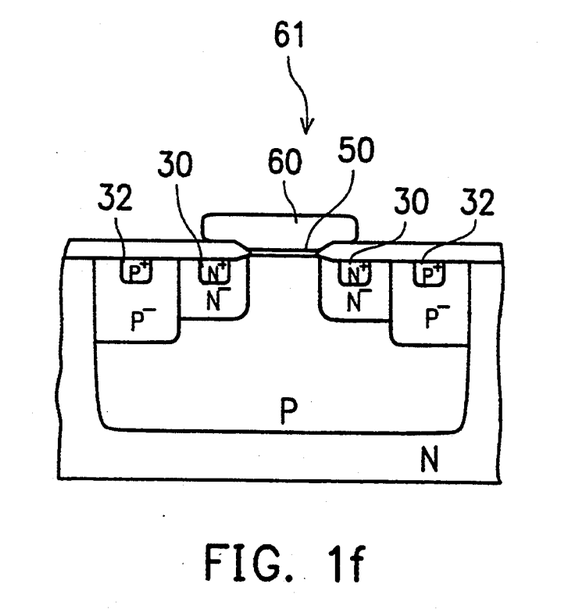

As shown in FIG. 1f, metal layers are deposited and patterned using conventional techniques to form a metal gate 60 of an NMOS transistor 61 and metal contacts of the P+ contact regions 32 (not shown in the figure), and the N+ source and drain electrode regions 30 (not shown in the figure). This is done by conventional deposition, lithography, and etching steps that are well understood by those skilled in the art.

Another embodiment of the present invention, which is applied to an N type substrate 1 to produce a high voltage PMOS transistor, is described hereinbelow. For convenience, similar elements are labeled with the same numerals as those of the first embodiment.

STEP 1

Figure 2A:
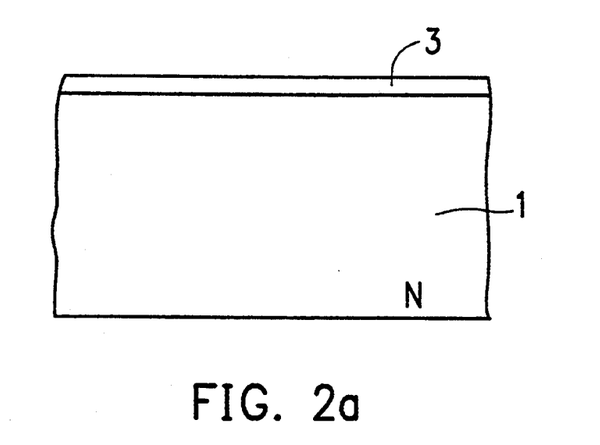
FIGS. 2a to 2f are cross sectional views showing a method of manufacturing a high voltage PMOS transistor on an N type substrate according to the present invention.

As shown in FIG. 2a, an oxide layer 3 is grown on the N type substrate 1 by conventional technique such as thermal oxidation. However, this step is not necessary, and can be neglected.

STEP 2

Figure 2B:
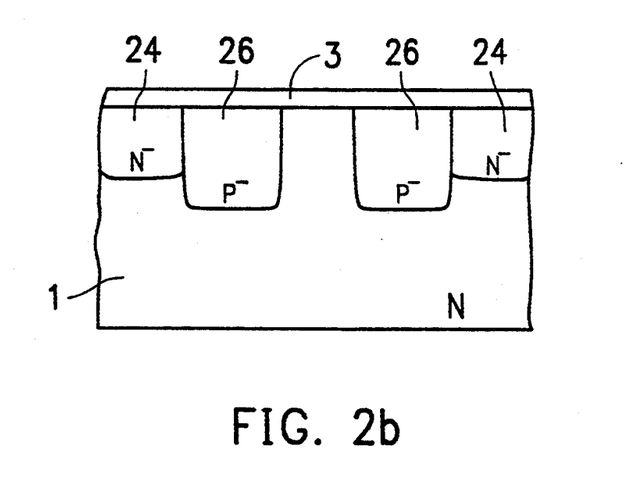

As shown in FIG. 2b, N type and P type impurities are implanted and diffused into the N type substrate 1, to form two N− drifting regions 24 and two P− drifting regions 26 using conventional lithography technology.

STEP 3

Figure 2C:
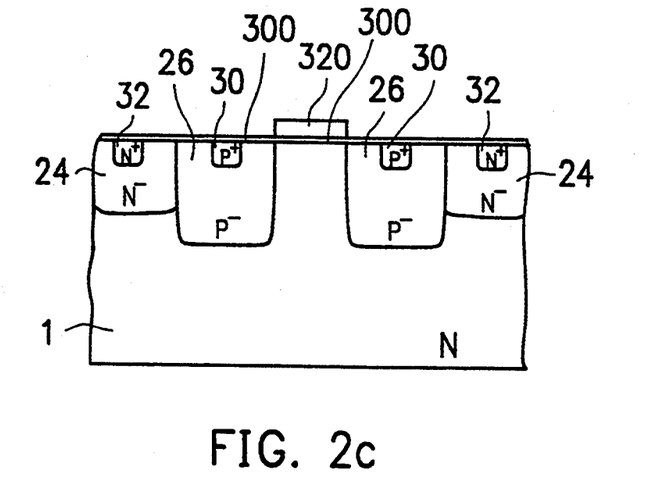

As shown in FIG. 2c, P type impurity is implanted into the P− drifting regions 26, to form P+ source and drain electrode regions 30. N type impurity is implanted into the N− drifting regions 24, to form N+ contact regions 32 of the substrate 1. These two processes uses the same lithography technology used in step 2. For example, pad oxide layer 300 and silicon nitride layer 320 are first grown after oxide layer 3 has been removed; then the silicon nitride layer 320 is etched by conventional lithography technology. P type and N type impurities are then implanted. It does not matter whether the P type impurity or the N type impurity is implanted first.

STEP 4

Figure 2D:
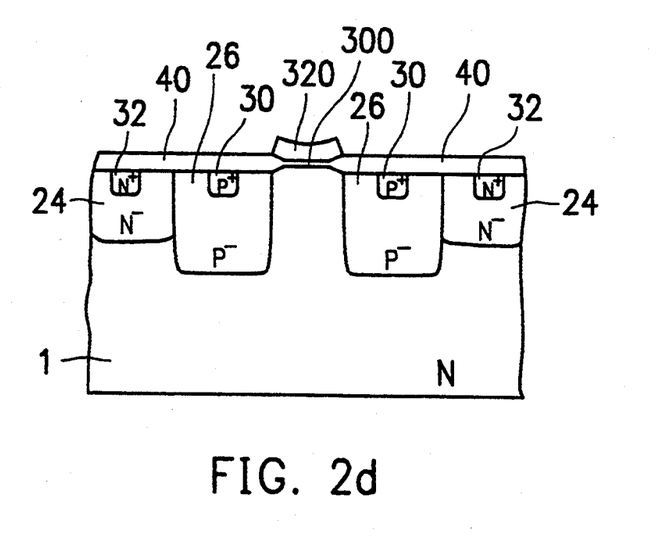

As shown in FIG. 2d, a field oxide layer 40 is formed on the P− drifting regions 26, the N− drifting regions 24, the P+ source and drain electrode regions 30, and the N+ contact regions 32 by, for example, thermally growing the field oxide layer 40 in a suitable oxidizing atmosphere.

STEP 5

Figure 2E:
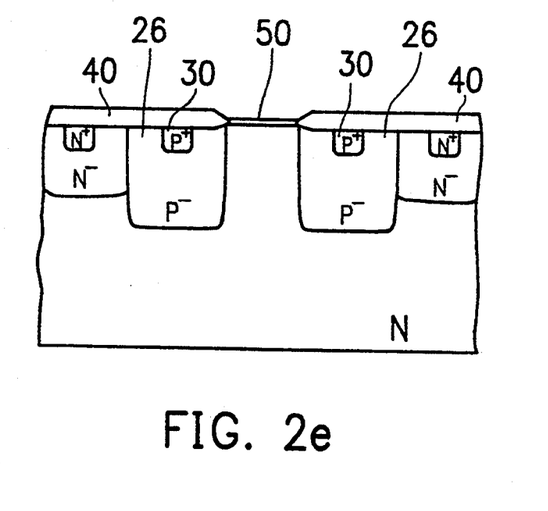

As shown in FIG. 2e, a gate oxide layer 50 is formed between the P− drifting regions 26. This is done by, for example, removing the silicon nitride layer 320 and the pad oxide layer 300 (shown in FIG. 2d), then thermally growing the gate oxide layer 50.

STEP 6

Figure 2F:
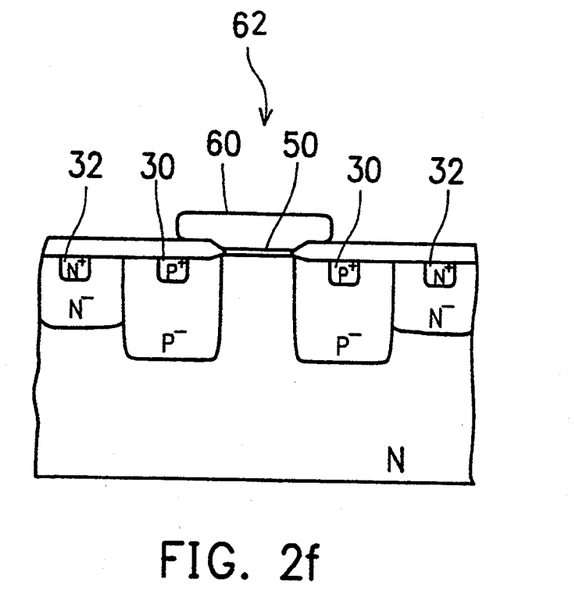
Figure 3A:
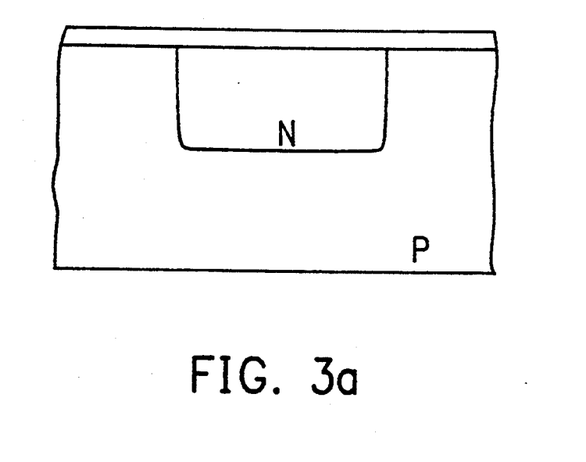
FIGS. 3a to 3f are cross sectional views showing a method of manufacturing a high voltage PMOS transistor on an P type substrate according to the present invention.
Figure 3B:
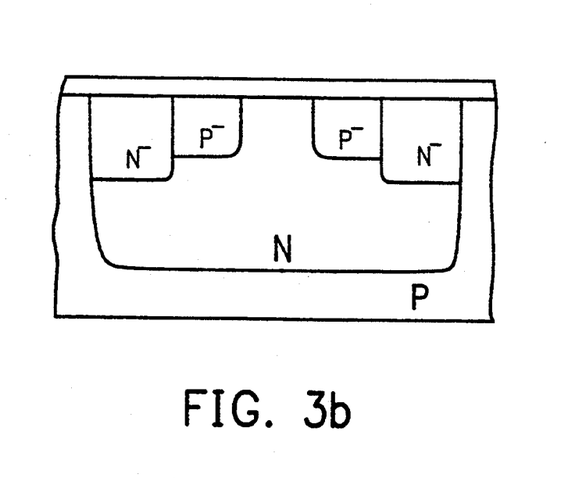
Figure 3C:
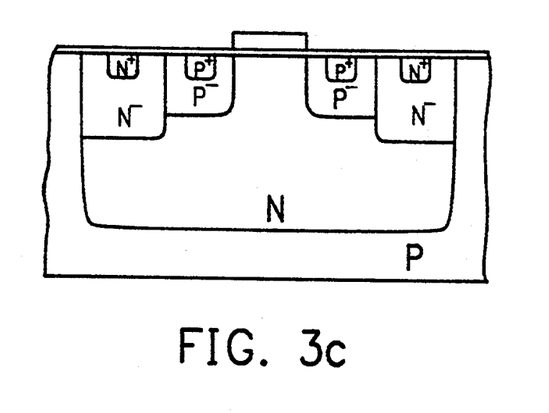
Figure 3D:
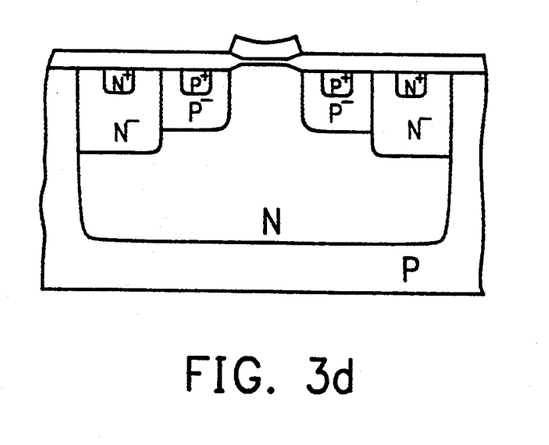
Figure 3E:
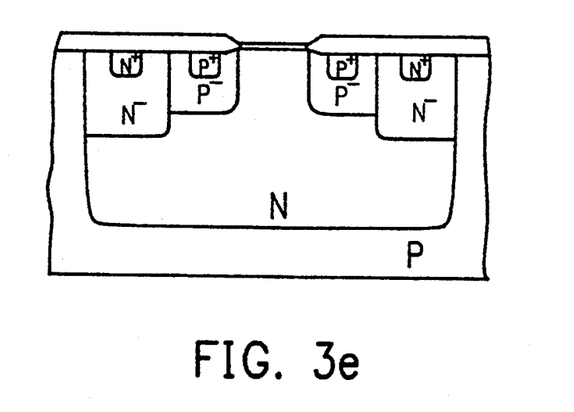
Figure 3F:
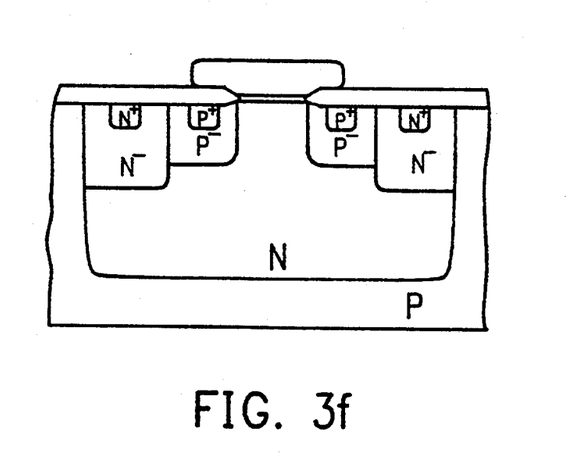
Figure 4A:
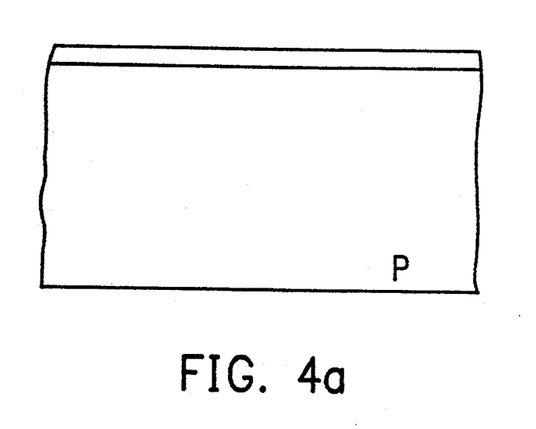
FIGS. 4a to 4f are cross sectional views showing a method of manufacturing a high voltage NMOS transistor on an P type substrate according to the present invention.
Figure 4B:
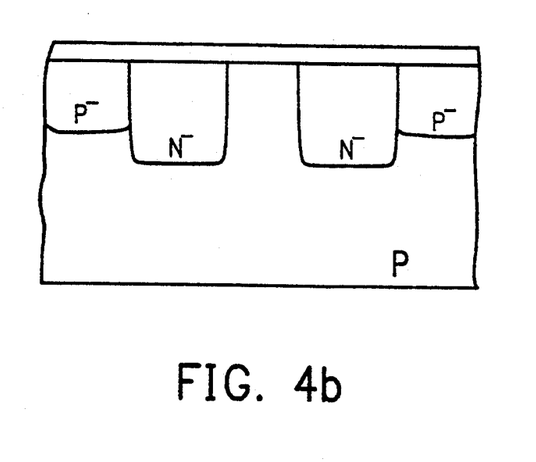
Figure 4C:
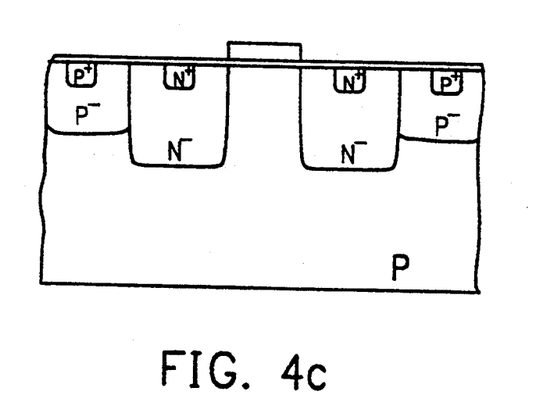
Figure 4D:
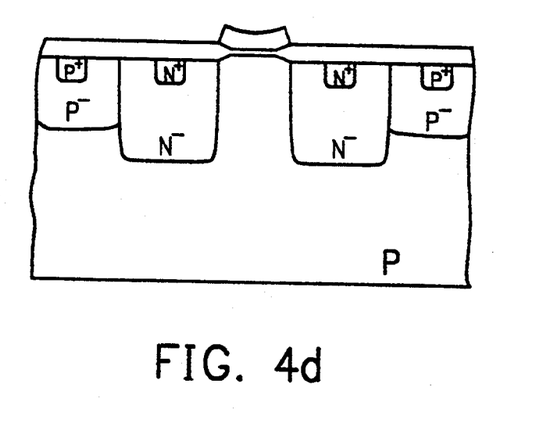
Figure 4E:
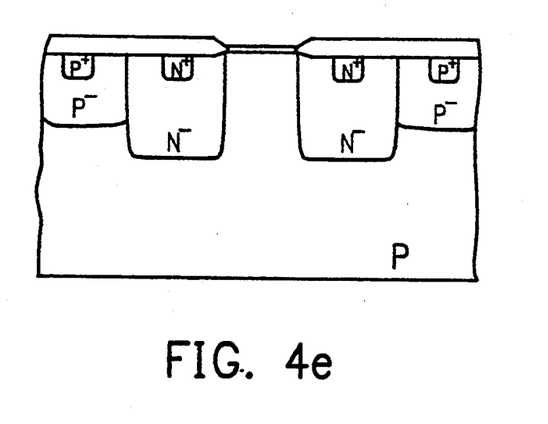
Figure 4F:
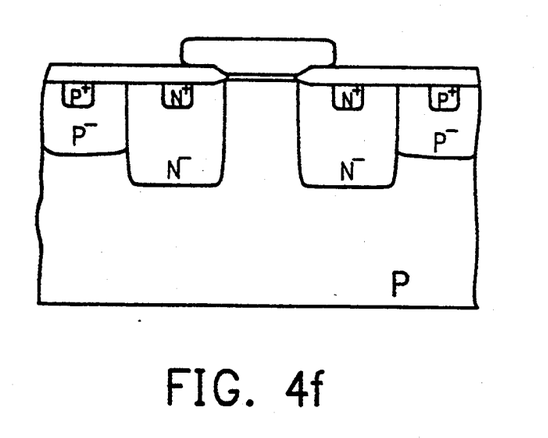

As shown in FIG. 2f, metal layers are deposited and patterned using conventional techniques to form a metal gate 60 of a PMOS transistor 62. This is done by conventional deposition, lithography, and etching steps that are well understood by those skilled in the art.

Although not described in detail, it is apparent to those skilled in the art that the methods can be applied to a P type substrate to produce a high voltage PMOS transistor as shown in FIGS. 3a to 3f. Another embodiment to produce a high voltage NMOS on a P type substrate is shown in FIGS. 4a to 4f.

The NMOS and PMOS transistors made according to the present invention have heavily doped source and drain electrode regions implanted in the lightly doped drifting regions, and a metal gate instead of a poly silicon gate formed on the gate oxide between the source and drain electrode regions. Therefore, the NMOS and PMOS transistors are capable of resisting a relatively high voltage and are not easily latched up. Furthermore, because conventional processes are replaced by implantation processes which take less time, the cycle time of the processes is reduced, therefore minimizing the cost of manufacture.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation, so as to encompass all such modifications and similar structures.

What is claimed is:

1. A method for fabricating an NMOS transistor on an N type substrate, comprising the steps of:
   (a) forming a P well in a predetermined region of said substrate;
   (b) implanting N type impurity into predetermined regions in the P well, to form two N− drifting regions;
   (c) implanting P type impurity into at least one predetermined regions in the P well, to form at least one P− drifting region;
   (d) implanting N type impurity into predetermined regions in the N− drifting regions, to form N+ source and drain electrodes for said NMOS transistor;
   (e) implanting P type impurity into the at least one P− drifting region, to form at least one P+ contact region of the P well;
   (f) forming a field oxide layer over the N− drifting regions, the N+ source and drain electrodes, the P− drifting region, and the at least one P+ contact region;
   (g) forming a gate oxide layer over the field oxide layer and between the N− drifting regions; and
   (h) forming a metal gate for said NMOS transistor over the gate oxide layer.

2. A method for fabricating a high voltage PMOS transistor on an N type substrate, comprising the steps of:
   (a) implanting P type impurity into predetermined regions in said substrate, to form two P− drifting regions;
   (b) implanting N type impurity into at least one predetermined regions in said substrate, to form at least one N− drifting region;
   (c) implanting N type impurity into the at least one N− drifting region, to form at least one N+ contact region of said substrate;
   (d) implanting P type impurity into predetermined regions in the P− drifting regions, to form P+ source and drain electrodes for said PMOS transistor;
   (e) forming a field oxide layer over the at least one N− drifting region, the at least one N+ contact region, the P− drifting regions, and the P+ source and drain electrodes;

(f) forming a gate oxide layer over the field oxide layer and between the P− drifting regions; and (g) forming a metal gate for said PMOS transistor over the gate oxide layer.

3. A method for fabricating an PMOS transistor on an P type substrate, comprising the steps of:

(a) forming a N well in a predetermined region of said substrate;

(b) implanting P type impurity into predetermined regions in the N well, to form two P− drifting regions;

(c) implanting N type impurity into at least one predetermined regions in the N well, to form at least one N− drifting region;

(d) implanting P type impurity into predetermined regions in the P− drifting regions, to form P+ source and drain electrodes for said PMOS transistor;

(e) implanting N type impurity into the at least one N− drifting region, to form at least one N+ contact region of the N well;

(f) forming a field oxide layer over the P− drifting regions, the P+ source and drain electrodes, the N− drifting region, and the at least one N+ contact region;

(g) forming a gate oxide layer over the field oxide layer and between the P− drifting regions; and (h) forming a metal gate for said PMOS transistor over the gate oxide layer.

4. A method for fabricating a high voltage NMOS transistor on an P type substrate, comprising the steps of:

(a) implanting N type impurity into predetermined regions in said substrate, to form two N− drifting regions;

(b) implanting P type impurity into at least one predetermined regions in said substrate, to form at least one P− drifting region;

(c) implanting P type impurity into the at least one P− drifting region, to form at least one P+ contact region of said substrate;

(d) implanting N type impurity into predetermined regions in the N− drifting regions, to form N+ source and drain electrodes for said NMOS transistor;

(e) forming a field oxide layer over the at least one P− drifting region, the at least one P+ contact region, the N− drifting regions, and the N+ source and drain electrodes;

(f) forming a gate oxide layer over the field oxide layer and between the N− drifting regions; and (g) forming a metal gate for said NMOS transistor over the gate oxide layer.

* * * * *